United States Patent
Kim

(10) Patent No.: US 8,362,459 B2
(45) Date of Patent: Jan. 29, 2013

(54) LIGHT EMITTING DEVICE, LIGHT EMITTING DEVICE PACKAGE, AND LIGHTING SYSTEM

(75) Inventor: Sun Kyung Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/029,685

(22) Filed: Feb. 17, 2011

(65) Prior Publication Data

US 2011/0204324 A1    Aug. 25, 2011

(30) Foreign Application Priority Data

Feb. 25, 2010    (KR) .................. 10-2010-0016969

(51) Int. Cl.
*H01L 33/00*    (2010.01)
(52) U.S. Cl. .............. 257/13; 257/98; 257/E33.012; 438/29
(58) Field of Classification Search .......... 257/13, 257/98, 100, E33.068, E33.069; 438/29, 438/32
See application file for complete search history.

(56) References Cited

U.S. PATENT DOCUMENTS

| | | | |
|---|---|---|---|
| 6,274,890 B1 * | 8/2001 | Oshio et al. ............ | 257/98 |
| 2004/0119077 A1 * | 6/2004 | Misra et al. ............ | 257/79 |
| 2005/0230699 A1 * | 10/2005 | Wu et al. ............... | 257/98 |
| 2006/0047346 A1 | 3/2006 | Yim et al. | |
| 2006/0192471 A1 | 8/2006 | Inoue et al. | |
| 2006/0270206 A1 | 11/2006 | Cho et al. | |
| 2007/0188084 A1 | 8/2007 | Fukuoka et al. | |
| 2008/0029773 A1 * | 2/2008 | Jorgenson ............... | 257/94 |
| 2008/0142780 A1 | 6/2008 | Bader et al. | |
| 2009/0026468 A1 | 1/2009 | Sakai et al. | |
| 2010/0314645 A1 | 12/2010 | Kim | |

FOREIGN PATENT DOCUMENTS

| | | |
|---|---|---|
| JP | 2002-134786 A | 5/2002 |
| JP | 2008-227103 A | 9/2008 |
| KR | 10-0522844 B1 | 10/2005 |
| KR | 10-2007-0068061 A | 6/2007 |

* cited by examiner

*Primary Examiner* — Julio J Maldonado
*Assistant Examiner* — Daniel Shook
(74) *Attorney, Agent, or Firm* — McKenna Long & Aldridge LLP

(57) ABSTRACT

The light emitting device includes a substrate, a first conductive type semiconductor layer, an active layer, a second conductive type semiconductor layer, and a light-transmitting electrode layer. The second conductive type semiconductor layer has a thickness satisfying Equation: $2 \cdot \Phi_1 + \Phi_2 = N \cdot 2\pi \pm \Delta$, ($0 \leq \Delta \leq \pi/2$), where $\Phi_1$ is a phase change that is generated when light of a vertical direction passes through the second conductive type semiconductor layer, $\Phi_2$ is a phase change that is generated when the light is reflected by the light-transmitting electrode layer, and N is a natural number.

19 Claims, 7 Drawing Sheets

LIGHT EMITTING DEVICE, LIGHT EMITTING DEVICE PACKAGE, AND LIGHTING SYSTEM

CROSS-REFERENCE TO RELATED APPLICATIONS

The present application claims priority under 35 U.S.C. §119(a) of Korean Patent Application No. 10-2010-0016969 filed on Feb. 25, 2010, which is hereby incorporated by reference in its entirety as if fully set forth herein.

BACKGROUND

The present disclosure relates to a light emitting device, a light emitting device package, and a lighting system.

Light emitting diodes (LEDs) are a sort of semiconductor devices that convert electrical energy into light. Compared to related art light sources such as fluorescent and incandescent lamps, LEDs have advantages of low power consumption, semi-permanent life span, fast response time, safety, and eco-friendliness. Accordingly, many studies are being conducted to replace the related art light sources with LEDs. Also, LEDs are being increasingly used as light sources of lighting apparatus such as various lamps used indoors or outdoors, liquid crystal display devices, electronic display boards, and street-lamps.

SUMMARY

Embodiments provide a light emitting device, light emitting device package, and lighting system having a new structure.

Embodiments provide a light emitting device, light emitting device package, and lighting system having improved light extraction efficiency.

In one embodiment, a light emitting device includes: a substrate; a light-emitting structure layer on the substrate, the light-emitting structure layer including a first conductive type semiconductor layer, a second conductive type semiconductor layer, and an active layer between the first and second conductive type semiconductor layers; and a light-transmitting electrode layer on the second conductive type semiconductor layer, wherein the second conductive type semiconductor layer has a thickness satisfying Equation (1): $2 \cdot \Phi 1 + \Phi 2 = N \cdot 2\pi \pm \Delta$, $(0 \leq \Delta \leq \pi/2)$, where $\Phi 1$ is a phase change that is generated when light of a vertical direction passes through the second conductive type semiconductor layer, $\Phi 2$ is a phase change that is generated when the light is reflected by the light-transmitting electrode layer, and N is a natural number.

In another embodiment, a light emitting device includes: a light-transmitting substrate; a light-emitting structure layer on the light-transmitting substrate, the light-emitting structure layer including a first conductive type semiconductor layer, a second conductive type semiconductor layer, and an active layer between the first and second conductive type semiconductor layers; and a light-transmitting electrode layer on the second conductive type semiconductor layer, wherein: the light-transmitting electrode layer transmits a portion of the incident light, and reflects the other portion of the incident light; the second conductive type semiconductor layer has a thickness satisfying Equation (1) to allow light reflected by the light-transmitting electrode layer and traveling to the light-transmitting substrate and light emitted from the active layer and traveling to the light-transmitting substrate to generate a constructive interference: $2 \cdot \Phi 1 + \Phi 2 = N \cdot 2\pi \pm \Delta$, $(0 \leq \Delta \leq \pi/2)$, where $\Phi 1$ is a phase change that is generated when light of a vertical direction passes through the second conductive type semiconductor layer, $\Phi 2$ is a phase change that is generated when the light is reflected by the light-transmitting electrode layer, and N is a natural number; the active layer has a thickness equal to or less than $\lambda/n_1$, where $n_1$ is a refractive index of the active layer, and $\lambda$ is a wavelength of light emitted from the active layer; and the light-transmitting substrate has a refractive index lower than a refractive index of the first conductive type semiconductor layer.

In further another embodiment, a light emitting device package includes: a body; first and second lead electrodes on the body; a light emitting device on at least one of the first and second lead electrodes; and a molding member on the light emitting device, wherein the light emitting device includes: a substrate; a light-emitting structure layer on the substrate, the light-emitting structure layer including a first conductive type semiconductor layer, a second conductive type semiconductor layer, and an active layer between the first and second conductive type semiconductor layers; and a light-transmitting electrode layer on the second conductive type semiconductor layer, and the second conductive type semiconductor layer has a thickness satisfying Equation (1): $2 \Phi 1 + \Phi 2 = N \cdot 2\pi \pm \Delta$, $(0 \leq \Delta \leq \pi/2)$, where $\Phi 1$ is a phase change that is generated when light of a vertical direction passes through the second conductive type semiconductor layer, $\Phi 2$ is a phase change that is generated when the light is reflected by the light-transmitting electrode layer, and N is a natural number.

The details of one or more embodiments are set forth in the accompanying drawings and the description below. Other features will be apparent from the description and drawings, and from the claims.

DETAILED DESCRIPTION OF THE EMBODIMENTS

Figure 1:
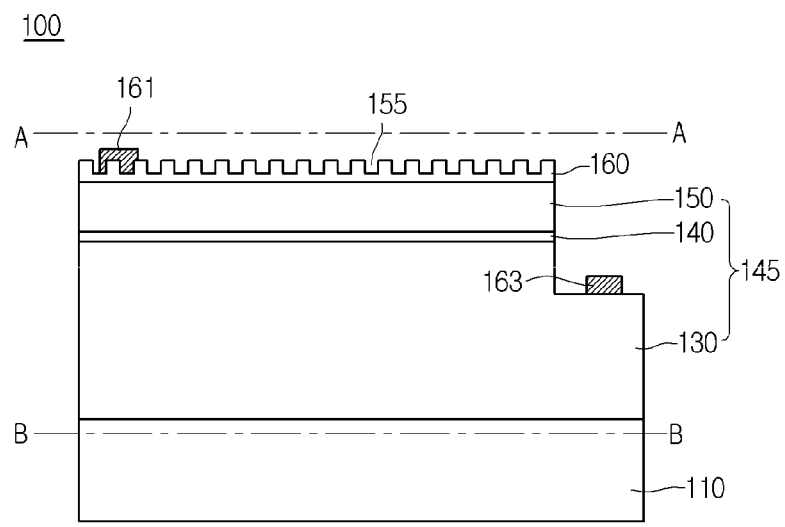
FIG. 1 is a side cross-sectional view illustrating a light emitting device according to a first embodiment.

Reference will now be made in detail to the embodiments of the present disclosure, examples of which are illustrated in the accompanying drawings.

In addition, the terms "first" and "second" can be selectively or exchangeably used for the members. In the figures, a dimension of each of elements may be exaggerated for clarity of illustration, and the dimension of each of the elements may be different from an actual dimension of each of the elements. Not all elements illustrated in the drawings must be included and limited to the present disclosure, but the elements except essential features of the present disclosure may be added or deleted. Also, in the descriptions of embodiments, it will be understood that when a layer (or film), a region, a pattern, or a structure is referred to as being 'on/above/over/upper' substrate, each layer (or film), a region, a pad, or patterns, it can be directly on substrate each layer (or film), the region, the pad, or the patterns, or intervening layers may also be present. Further, it will be understood that when a layer is referred to as being 'under/below/lower' each layer (film), the region, the pattern, or the structure, it can be directly under another layer (film), another region, another pad, or another patterns, or one or more intervening layers may also be present. Therefore, meaning thereof should be judged according to the spirit of the present disclosure.

Hereinafter, a light emitting device, light emitting device package, and lighting system according to embodiments will be described in detail with reference to the accompanying drawings.

FIG. 1 is a side cross-sectional view illustrating a light emitting device 100 according to a first embodiment.

Referring to FIG. 1, the light emitting device 100 according to the first embodiment may include a substrate 110, a first conductive type semiconductor layer 130 on the substrate 110, an active layer 140 on the first conductive type semiconductor layer 130, a second conductive type semiconductor layer 150 on the active layer 140, a light-transmitting electrode layer 160 on the second conductive type semiconductor layer 150, a first electrode on the first conductive type semiconductor layer 130, and a second electrode 161 on the light-transmitting electrode layer 160.

The thickness h of the second conductive type semiconductor layer 150 may be formed to satisfy Equation (1):

$$2\cdot\Phi1+\Phi2 = N\cdot 2\pi \pm \Delta, (0 \leq \Delta \leq \pi/2) \quad (1)$$

where $\Phi1$ is a phase change that is generated when light of a vertical direction passes through the second conductive type semiconductor layer 150, $\Phi2$ is a phase change that is generated when the light is reflected by the light-transmitting electrode layer 160, and N is a natural number.

The vertical direction may be a thickness direction of the active layer 140 and the second conductive type semiconductor layer 150.

The thickness h of the second conductive type semiconductor layer 150 may satisfy a condition that generates a constructive interference between light generated in the active layer 140 and light reflected by the light-transmitting electrode layer 160, thereby improving the light extraction efficiency of the light emitting device 100.

Hereinafter, components of the light emitting device 100 according to an embodiment will be described in detail.

The substrate 110 may be formed of materials having light-transmittance, for example, at least one of sapphire ($Al_2O_3$), GaN, ZnO, and AlN, but embodiments are not limited thereto. The refractive index of the substrate 110 may be smaller than that of the first conductive type semiconductor layer for the light extraction efficiency.

The first conductive type semiconductor layer 130 may be formed on the substrate 110. Also, an undoped semiconductor layer may be further disposed between the first conductive type semiconductor layer 130 and the substrate 110, but embodiments are not limited thereto.

The first conductive type semiconductor 130 may include an n-type semiconductor layer. The n-type semiconductor layer may be selected from semiconductor material having a chemical formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, and AlInN, and may be doped with n-type dopants such as Si, Ge, and Sn.

The undoped semiconductor layer may be formed to improve the crystallinity of the first conductive type semiconductor layer 130, and may have significantly low electrical conductivity compared to the first conductive type semiconductor layer because it is not doped with the n-type dopant.

The active layer 140 may be disposed on the first conductive type semiconductor layer 130. The active layer 140 may be formed of semiconductor materials having a chemical formula of $In_xAl_yGa_{1-x-y}N$ ($0 \leq x \leq 1$, $0 \leq y \leq 1$, $0 \leq x+y \leq 1$), and may include at least one of quantum wire structure, quantum dot structure, and single quantum well or multi quantum well (MQW) structure.

The active layer 140 may generate light using energy generated in the course of recombination of electrons and holes that are provided from the first conductive type semiconductor layer 130 and the second conductive type semiconductor layer 150.

The second conductive type semiconductor layer 150 may be disposed on the active layer 140. The second conductive type semiconductor layer 150 may be implemented using a p-type semiconductor layer. The p-type semiconductor layer may be selected from semiconductor materials having a chemical formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, and AlInN. The p-type semiconductor layer may be doped with p-type dopant such as Mg, Zn, Ca, Sr, and Ba.

Unlike the above description, the first conductive type semiconductor layer 130 may include a p-type semiconductor layer, and the second conductive type semiconductor layer 150 may include an n-type semiconductor layer. Also, a third conductive type semiconductor layer (not shown) including an n-type or p-type semiconductor layer may be disposed on the first conductive type semiconductor layer 130. Accordingly, the light emitting device 110 may have one of n-p, p-n, n-p-n, and p-n-p junction structures. Also, the doping concentration of the conductive type dopant may be uniform or non-uniform in the first conductive type semiconductor layer 130 and second conductive type semiconductor layer 150. That is, the plurality of semiconductor layers may have various structures without being limited to those described herein.

The light-transmitting electrode layer 160 may be disposed on the second conductive type semiconductor layer 150. The light-transmitting electrode layer 160 may serve to reduce a contact resistance between the second electrode 161 and the second conductive type semiconductor layer 150, and may evenly spread a current.

For example, the light-emitting electrode layer 160 may include at least one of Indium tin Oxide (ITO), In—ZnO (IZO), Ga—ZnO (GZO), Al—ZnO (AZO), Al—Ga ZnO (AGZO), In—Ga ZnO (IGZO), indium gallium tin oxide (IGTO), aluminum zinc oxide (AZO), antimony tin oxide (ATO), gallium zinc oxide (GZO), ITO nitride (ITON), IZO nitride (IZON), IrOx, RuOx, RuOx/ITO, Ni/IrOx/Au, and Ni/IrOx/Au/ITO. The light-emitting electrode layer 160 may be formed of a material having a lower refractive index than that of a compound semiconductor layer, for example, a refractive index of about 1.7 to about 2.1.

On the other hand, a light extraction structure 155 may be formed on the top surface of the light-emitting electrode layer 160, or in the upper portion of the light-emitting electrode layer 160 and second conductive type semiconductor layer 150. The light extraction structure 155 may be formed to efficiently extract light generated in the active layer 140, and may have a random roughness or regular pattern.

For example, the light extraction structure 155 may have a photonic crystal structure that can transmit and reflect light of a specific wavelength range. The photonic crystal structure may be formed to have a period of about 50 nm to about 3,000 nm.

The first electrode 163 may be disposed on the first conductive type semiconductor layer 130, and the second electrode 161 may be disposed on the light-emitting electrode layer 160.

The first electrode 163 and the second electrode 161 may provide power from an external power source to the light emitting device 100.

The first electrode 163 and the second electrode 161 may be formed in a single- or multi-layer structure including at least one of Al, Ti, Cr, Ni, Cu, and Au.

In the light emitting device 100 according to an embodiment, the thickness h of the second conductive type semiconductor layer 150 may be formed to satisfy Equation (1) that can be expressed as $2 \cdot \Phi1 + \Phi2 = N \cdot 2\pi \pm \Delta$, $(0 \leq \Delta \leq \pi/2)$ as described above.

Here, $\Phi1$ is a phase change that is generated when light of a vertical direction passes through the second conductive type semiconductor layer 150, and $\Phi2$ is a phase change that is generated when the light is reflected by the light-transmitting electrode layer 160. N is a natural number.

The phase change $\Phi1$ represents a phase change when light passes through a medium like the second conductive type semiconductor layer 150, and may vary according to the wavelength of light, and the refractive index and thickness of the medium. Specifically, the phase change $\Phi1$ equals $2\pi n_2 d/\lambda$, where $n_2$ denotes a refractive index of the second conductive type semiconductor layer 150, $\lambda$ denotes a wavelength of light emitted from the active layer 140, and d denotes the thickness of the second conductive type semiconductor layer 150. The refractive index of the second conductive type semiconductor layer 150 may range from about 2.12 to 2.44 when the wavelength of light is about 450 nm. For example, the refractive index of GaN may be about 2.44. The wavelength of light may include a blue wavelength band such as about 440 nm to about 480 nm, a visible band, or an ultraviolet band. The refractive index and thickness of the second conductive type semiconductor layer 150 may vary according to the wavelength of light.

Also, the phase change $\Phi2$ represents a phase change when light is reflected by the light-transmitting electrode layer 160. Since the light-transmitting electrode layer 160 is formed of a material having a density less than that of the second conductive type semiconductor layer 150, light reflected by the light-transmitting electrode layer 160 may undergo reflection at free end. Accordingly, the phase is not changed or changed into a value near about 0 degree. When the phase change $\Phi2$ equals 0, the thickness h of the second conductive type semiconductor layer 150 may be formed to satisfy Equation that can be expressed as $2 \cdot \Phi1 = N \cdot 2\pi \pm \Delta$, $(0 \leq \Delta \leq \pi/2)$.

The thickness h may satisfy a condition that generates a constructive interference between light generated in the active layer 140 and light reflected by the light-transmitting electrode layer 160, thereby improving the light extraction efficiency of the light emitting device 100.

Specifically, a portion of light generated in the active layer 140 and traveling to the light-transmitting electrode layer 160 may transmit through the light-transmitting electrode layer 160, and the other portion of light may be reflected by the light-transmitting electrode layer 160.

Light reflected by the light-transmitting electrode layer 160 may again travel to the active layer 140 to cause an interference with light generated in the active layer 140. In this case, whether the interference becomes a constructive interference or a destructive interference considerably depends on the thickness h of the second conductive type semiconductor layer 150.

Accordingly, in the present embodiment, the light extraction efficiency of the light emitting device 100 can be improved by amplifying the intensity of light using a constructive interference effect resulting from the thickness h of the second conductive type semiconductor layer 150.

On the other hand, the thickness of the active layer 140 may be equal to or less than $\lambda/n_1$ ($n_1$: refractive index of active layer, $\lambda$: wavelength of light emitting from active layer) in order to obtain the constructive interference effect as described above. When the thickness of the active layer 140 is greater than $\lambda/n_1$, light generated in one region of the active layer 140 may generate a constructive interference, and light generated in the other region of the active layer 140 may generate a destructive interference. The refractive index of the active layer 140 may range from about 2.12 to about 2.44 when the wavelength of light is about 450 nm. For example, the refractive index of InGaN may be about 2.44. The wavelength of light may include a blue wavelength band such as about 440 nm to about 480 nm, a visible band, or an ultraviolet band. The refractive index and thickness of the second conductive type semiconductor layer 150 may vary according to the wavelength of light. Also, the thickness h may be determined by the condition that generates a constructive interference of light of the vertical direction. In this case, since the second conductive type semiconductor layer 150 is formed to have a thickness of about several hundred nanometers, the vertical component of light predominantly acts, and there is a great possibility that a quantum interference phenomenon occurs.

Also, the thickness h may have a range of $\Delta$, $0 \leq \Delta \leq \pi/2$, which represents a range in which the constructive interference effect is predominant over the destructive interference effect.

The improvement of the light extraction efficiency according to definition of the thickness of the second conductive type semiconductor layer 150 of the light emitting device 100 may also be verified by an experimental result.

Figure 2:
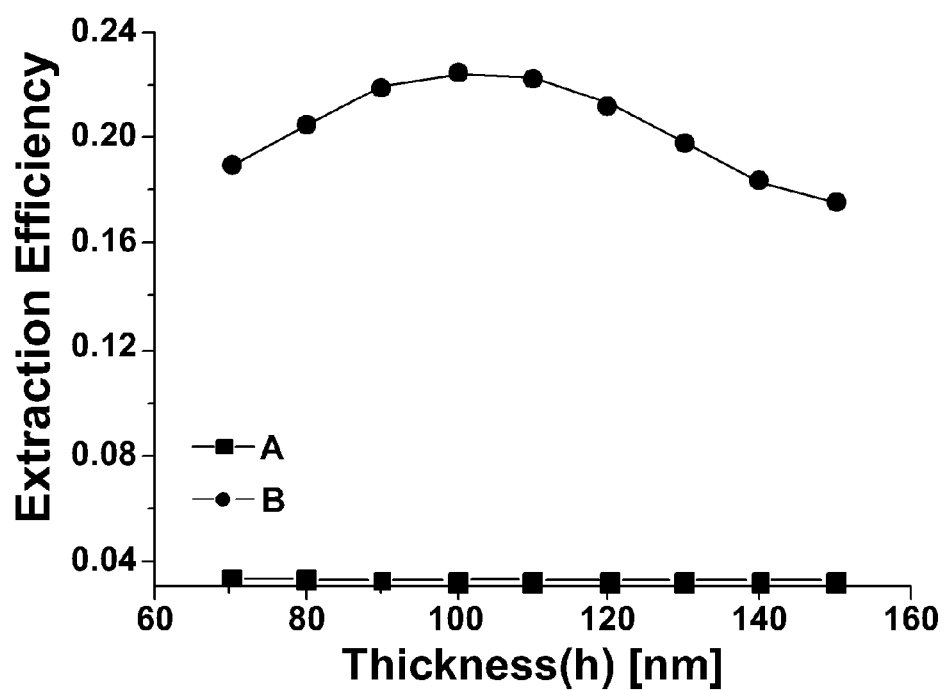
FIG. 2 is a graph illustrating an experimental result obtained by measuring a change of the light extraction efficiency according to the thickness of a second conductive type semiconductor layer of a light emitting device.

FIG. 2 is a graph illustrating an experimental result obtained by measuring a change of the light extraction efficiency according to the thickness of a second conductive type semiconductor layer of a light emitting device.

In the above experiment, a sapphire substrate having a refractive index of about 1.78 was used for the substrate 110, and a InAlGaN-based compound semiconductor having a refractive index of about 2.46 was used for the first conductive type semiconductor layer 130, the active layer 140, and the second conductive type semiconductor layer 150. Also, ITO having a refractive index of about 2.0 was used for the light-transmitting electrode layer 160.

The x-axis of the graph of FIG. 2 represents the thickness of the second conductive type semiconductor layer 150, and the y-axis represents the light extraction efficiency of the light emitting device. Also, the line A represents a result obtained by measuring the light extraction efficiency of the section A of FIG. 1, and the line B represents a result obtained by measuring the light extraction efficiency of the second B of FIG. 1.

Referring to FIG. 2, the light extraction efficiency of light emitted through the section A of FIG. 1 has no relation with the thickness of the second conductive type semiconductor layer 150. On the other hand, the light extraction efficiency of light emitted through the section B of FIG. 1 varies according to the thickness of the second conductive type semiconductor layer 150, and shows the maximum value at a range from about 90 nm to about 110 nm, preferably, near 100 nm, that satisfies the condition of $2 \cdot \Phi 1 + \Phi 2 = N \cdot 2 \cdot \pm \Delta$, $(0 \leqq \Delta \leqq \pi/2)$.

In other words, it can be verified that the light extraction efficiency of light emitted through the section B of the substrate 110 shows the maximum value when the thickness h of the second conductive type semiconductor layer 150 satisfies the condition of the constructive interference described above.

However, since the light extraction efficiency of light emitted through the top surface of the light-transmitting electrode layer 160 does not undergo the constructive interference effect according to the thickness h of the second conductive type semiconductor layer 150, there is no significant difference even when the thickness h of the second conductive type semiconductor layer 150 changes Hereinafter, a method for fabricating a light emitting device 100 according to an embodiment will be described in detail. However, a description identical or similar to those described above will be omitted or briefed.

FIGS. 3 to 7 are views illustrating a method for fabricating a light emitting device 100 according to an embodiment.

Figure 3:
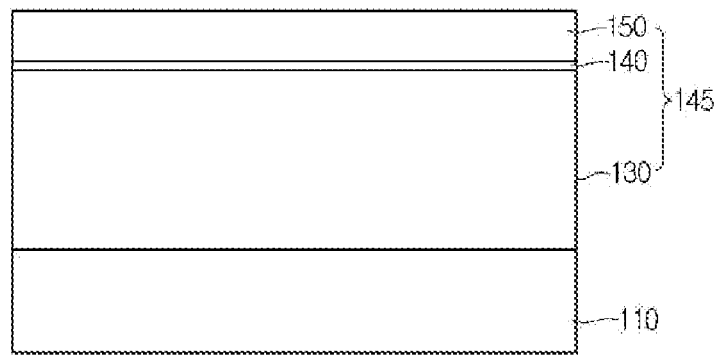
FIGS. 3 to 7 are views illustrating a method for fabricating a light emitting device according to an embodiment.

Referring to FIG. 3, a first conductive type semiconductor layer 130, an active layer 140, and a second conductive type semiconductor layer 150 may be sequentially formed on the substrate 110.

The first conductive type semiconductor layer 130, the active layer 140, and the second conductive type semiconductor layer 150 may be formed by Metal Organic Chemical Vapor Deposition (MOCVD), Chemical Vapor Deposition (CVD), Plasma-Enhanced Chemical Vapor Deposition (PECVD), Molecular Beam Epitaxial (MBE), and Hydride Vapor Phase Epitaxial (HVPE), but embodiments are not limited thereto.

Figure 4:
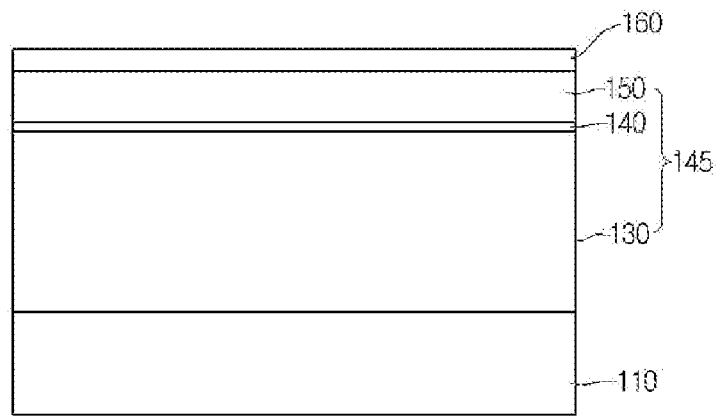

Referring to FIG. 4, a light-transmitting electrode layer 160 may be formed on the second conductive type semiconductor layer 150.

The light-transmitting electrode layer 160 may be formed by sputtering, E-beam deposition, and Plasma Enhanced Chemical Vapor Deposition (PECVD), but embodiments are not limited thereto.

Figure 5:
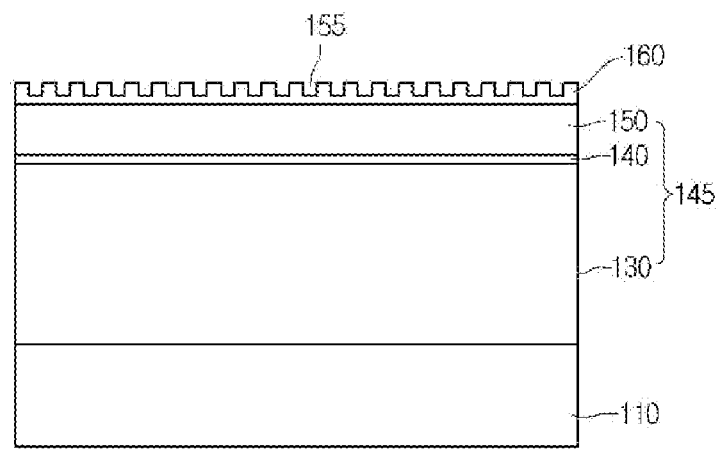

Referring to FIG. 5, a light extraction structure 155 may be formed by patterning the light-transmitting electrode layer 160.

The patterning may be performed by a lithography process including a photolithography process.

Figure 6:
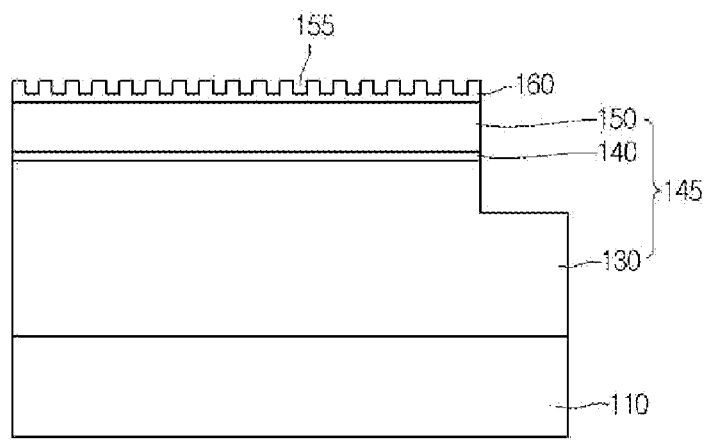

Referring to FIG. 6, a mesa etching may be performed to expose a portion of the top surface of the first conductive type semiconductor layer 130.

Figure 7:
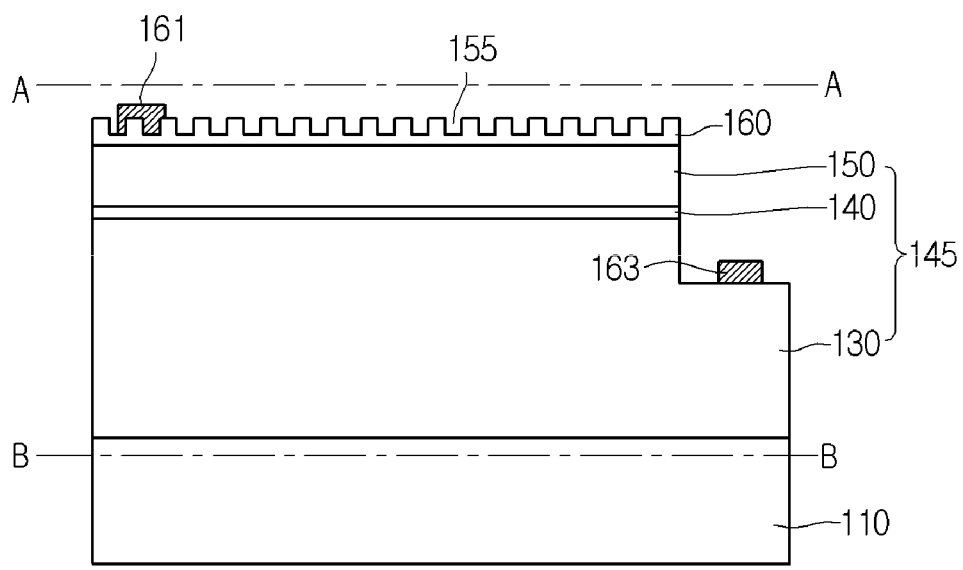

The top surface of the first conductive type semiconductor layer 130 may be exposed by the mesa etching to form a first electrode (163 of FIG. 7).

Referring to FIG. 7, the first electrode 163 may be formed on the expose surface of the first conductive type semiconductor layer 130, and a second electrode 161 may be formed on the light-transmitting electrode layer 160 to provided the light emitting device 100 according to an embodiment.

Figure 8:
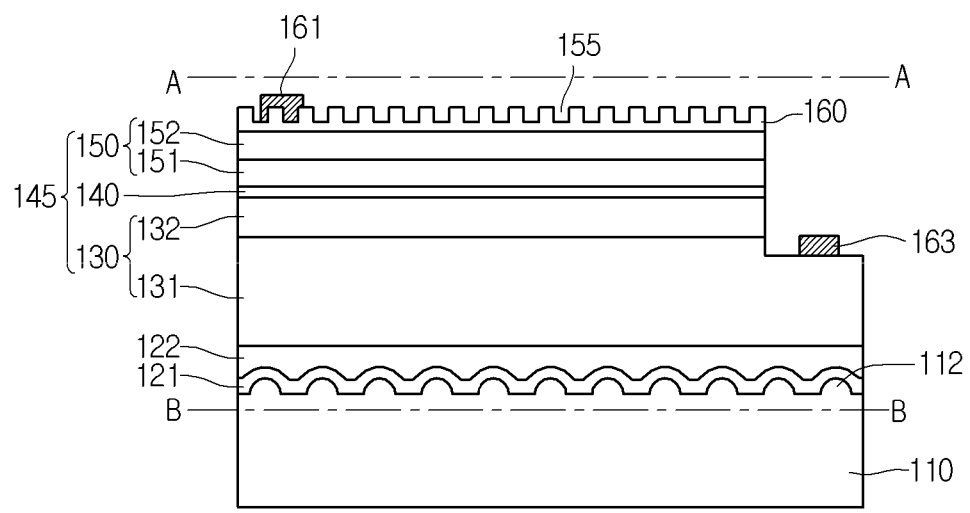
FIG. 8 is a side cross-sectional view illustrating a light emitting device according to a second embodiment.

FIG. 8 is a side cross-sectional view illustrating a light emitting device according to a second embodiment.

Referring to FIG. 8, the light emitting device may include a substrate 110, a first semiconductor layer 121, a second semiconductor layer 122, a light-emitting structure layer 145, a light-transmitting electrode layer 160, a first electrode layer 163, and a second electrode 161.

The top surface of the substrate 110 may have an uneven structure 112. The uneven structure 112 may include a plurality of protrusions on the top surface of the substrate. The interval between the plurality of protrusions may be regular or irregular, and the sizes of the plurality of protrusions may be uniform or random. The sectional shape of the plurality of protrusions may include at least one of hemispherical, polygonal cone, and polygonal shapes. The plurality of protrusions may be arranged at an interval of about ½ or ¼ of the wavelength of emitted light.

The substrate 110 may include a light-transmitting substrate such as sapphire substrate ($Al_2O_3$), GaN, SiC, and ZnO, and the thickness thereof may range from about 50 μm about 500 μm. The refractive index of the substrate 110 may be less than that of the first conductive type semiconductor layer 130.

The first semiconductor layer 121 may be disposed on the substrate 110. The first semiconductor layer 121 may be formed in a layer or pattern, by using compound semiconductors of Group II to VI elements, and may be formed of a material including at least one of ZnO, GaN, AlN, AlGaN, InGaN, InN, InAlGaN, AlInN, AlGaAs, GaP, GaAs, GaAsP, and AlGaInP. For example, the first semiconductor layer 121 may be formed as a buffer layer, which reduces a difference between the lattice constants of a nitride semiconductor and a substrate.

The first semiconductor layer 121 may be disposed at the protrusion of the unevenness structure, or may be formed in an unevenness layer.

The second semiconductor layer 122 may be disposed on the first semiconductor layer 121, and may be formed as an undoped semiconductor layer. For example, the second semiconductor layer 122 may include an undoped nitride semiconductor. The second semiconductor layer 122 may be a semiconductor layer undoped with a conductive type dopant, and may have much lower electrical conductivity than that of the first conductive type semiconductor layer. For example, the second semiconductor layer 122 may be an undoped GaN layer, and may have a characteristic of a first conductive type.

Also, at least one of the first semiconductor layer 121 and second semiconductor layer 122 may be formed with Super Lattice Structures (SLS), and may be formed of a material including at least one of GaN, InN, AlN, InGaN, AlGaN, and InAlGaN. The SLS may be formed by alternately repeating at least two layers having different energy band gaps in at least two cycles, and may include a stacked structure such as InGaN/GaN. Each layer of the SLS may be formed to have a thickness of several Å or more.

Also, at least one of the first semiconductor layer 121 and the second semiconductor layer 122 may be formed as a reflection layer by alternately stacking at least two layers having different refractive indexes. For example, at least one of the first semiconductor layer 121 and the second semiconductor layer 122 may be formed as Distributed Bragg Reflectors (DBR) by stacking a structure of GaN layer/AlN layer in at least two cycles.

The light-emitting structure layer 145 may be disposed on the second semiconductor layer 122, and may include a first conductive type semiconductor layer 130, an active layer 140, and a second conductive type semiconductor layer 150. Another semiconductor layer may be further disposed on/under each of the above layers, but embodiments are not limited thereto.

The first conductive type semiconductor layer 130 may be selected from compound semiconductors of Group III-V elements doped with a first conductive type dopant, for example, GaN, AlN, AlGaN, InGaN, InN, InAlGaN, AlInN, AlGaAs, GaP, GaAs, GaAsP, and AlGaInP. The first conductive type semiconductor layer 130 may be formed of a semiconductor material having a chemical formula of $In_xAl_yGa_{1-x-y}N$ ($0 \leq x \leq 1$, $0 \leq y \leq 1$, $0 \leq x+y \leq 1$).

The first conductive type semiconductor layer 130 may be an N-type semiconductor layer, and may include N-type dopants such as Si, Ge, Sn, Se, and Te. The first conductive type semiconductor layer 130 may function as an electrode contact layer, and may be formed in a single- or multi-layer, but embodiments are limited thereto.

The first conductive type semiconductor layer 130 may include a structure in which different semiconductor layers 131 and 132 are stacked. The stack structure may include a GaN/InGaN structure and a GaN/AlGaN structure. The different semiconductor layers 131 and 132 may include an SLS, in which two or more pairs of the GaN/InGaN structure and the GaN/AlGaN structure are stacked. Each layer of the SLS may have a thickness of several Å or more.

The first conductive type semiconductor layer 130 may include a third semiconductor layer 131 and a fourth semiconductor layer 132. The third semiconductor layer 131 may include an N-type dopant having a concentration higher than that of the fourth semiconductor layer 132. The fourth semiconductor layer 132 may become a conductive layer lower than the third semiconductor layer 131. The third semiconductor layer 131 may diffuse a current in a horizontal direction, and the fourth semiconductor layer 132, which is a high resistive layer, may allow a current to diffuse in the third semiconductor layer 131.

The third and fourth semiconductor layers 131 and 132 may include a structure in which semiconductor layers having different band gap are stacked.

The active layer 140 may be disposed between the first conductive type semiconductor layer 130 and the second conductive type semiconductor layer 150, and may include a barrier layer and a well layer alternately disposed therein. At least one of the barrier layer and the well layer may include a semiconductor material having a chemical formula of $In_xAl_yGa_{1-x-y}N$ ($0 \leq x \leq 1$, $0 \leq y \leq 1$, $0 \leq x+y \leq 1$). The band gap energy of the barrier layer in the active layer 140 may be greater than the band gap energy of the well layer.

A conductive type clad layer may be formed over and/or under the active layer 140. The conductive type clad layer may confine carriers with an energy band gap higher than the band gap energy of the barrier layer. A first conductive type clad layer may be disposed between the active layer 140 and the first conductive type semiconductor layer 130, and a second conductive type clad layer may be disposed between the active layer 140 and the second conductive type semiconductor layer 150.

The second conductive type semiconductor layer 150 may be selected from compound semiconductors of Group III-V elements doped with a second conductive type dopant, for example, GaN, AlN, AlGaN, InGaN, InN, InAlGaN, AlInN, AlGaAs, GaP, GaAs, GaAsP, and AlGaInP. The second conductive type semiconductor layer 150 may be formed of a semiconductor material having a chemical formula of $In_xAl_yGa_{1-x-y}N$ ($0 \leq x \leq 1$, $0 \leq y \leq 1$, $0 \leq x+y \leq 1$).

The second conductive type semiconductor layer 150 may include a fifth semiconductor layer 151 and a sixth semiconductor layer 152, which are formed as a P-type semiconductor layer.

The fifth semiconductor layer 151 may include a P-type dopant having a concentration higher than that of a P-type dopant of the sixth semiconductor layer 152. The sixth semiconductor layer 152 may become a conductive layer lower than the fifth semiconductor layer 151. The fifth semiconductor layer 151 may diffuse a current in a horizontal direction, and the sixth semiconductor layer 152, which is a high resistive layer, may allow a current to diffuse in the fifth semiconductor layer 151.

The fifth semiconductor layer 15 and the sixth semiconductor layer 152 may include an SLS in which different semiconductor layers having different band gap are stacked. The SLS may include a GaN/InGaN structure and a GaN/AlGaN structure. The SLL may include a structure in which two or more pairs of different layers of several Å or more are alternately stacked.

The fifth and sixth semiconductor layers 151 and 152 may have different refractive indexes. For example, the fifth semiconductor layer 151 may have a high refractive index, and the sixth semiconductor layer 152 may have a refractive index higher than the refractive index of the fifth semiconductor layer 151. A difference between the refractive indexes may improve the light extraction efficiency.

The light-transmitting electrode layer 160 may be formed on the second conductive type semiconductor layer 150. The light-transmitting electrode layer 160 may include a metal oxide or a metal nitride, for example, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), ITO nitride (ITON), IZO nitride (IZON), IrOx, RuOx, RuOx/ITO, Ni/IrOx/Au, and Ni/IrOx/Au/ITO, but embodiments are not limited thereto.

The area of the light-transmitting electrode layer 160 may be smaller than the area of the top surface of the second conductive type semiconductor layer 150, but embodiments are not limited thereto.

The top surface of the light-transmitting electrode layer 160 may include a light extraction structure 155. The light extraction structure 155 may include a photonic crystal structure that can transmit and reflect light of a specific wavelength range. The photonic crystal structure may be formed to have a period of about 50 nm to about 3,000 nm.

The second electrode 161 may contact the light-transmitting electrode layer 160 and the second conductive type semiconductor layer 150, but embodiments are not limited thereto.

The first electrode 163 may be disposed on the third semiconductor layer 131 of the first conductive type semiconductor layer 130. The area of the first electrode 163 may be formed to be about 7% or less of the area of the bottom surface of the first conductive type semiconductor layer 130.

The thickness of the second conductive type semiconductor layer 150 may satisfy $2 \cdot \Phi 1 + \Phi 2 = N \cdot 2\pi \pm \Delta$, ($0 \leq \Delta \leq \pi/2$). Here, $\Phi 1$ is a phase change that is generated when light of a vertical direction passes through the second conductive type semiconductor layer 150, $\Phi 2$ is a phase change that is generated when the light is reflected by the light-transmitting electrode layer 160, and N is a natural number. The vertical direction may be a thickness direction of the active layer 140 and the second conductive type semiconductor layer 150.

The thickness of the second conductive type semiconductor layer 150 may satisfy a condition that generates a constructive interference between light generated in the active layer 140 and light reflected by the light-transmitting electrode layer 160, thereby improving the light extraction efficiency of the light emitting device 100. The thickness of the second conductive type semiconductor layer 150 may range from about 90 nm to about 110 nm, and the thickness of the active layer 140 may be equal to or less than $\lambda/n_1$. Here, $n_1$ denotes the refractive index of the active layer 140, and λ denotes the wavelength of light emitted from the active layer 140.

Figure 9:
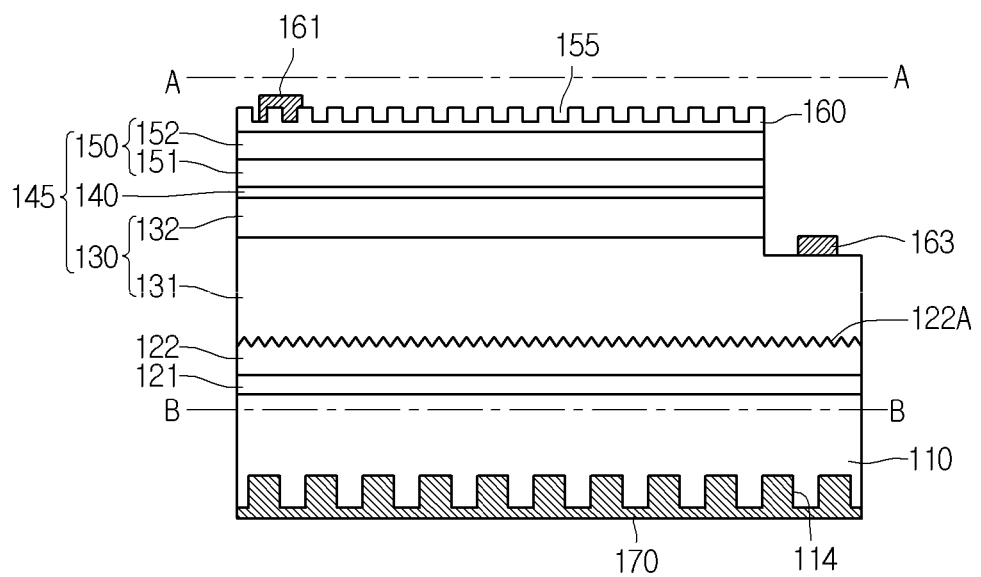
FIG. 9 is a side cross-sectional view illustrating a light emitting device according to a third embodiment.

FIG. 9 is a side cross-sectional view illustrating a light emitting device according to a third embodiment.

Referring to FIG. 9, in the light emitting device, the top surface of a second semiconductor layer 122 may be formed to have an unevenness structure 122A, and the lower side of the substrate 110 may be formed to have an unevenness structure 114.

The unevenness structure 122A of the second semiconductor layer 122 may include a plurality of protrusions spaced from each other. The interval between the protrusions may be regular or irregular. The unevenness structure 122A of the second semiconductor layer 122 may control the growth, or may be formed by an etching method, but embodiments are not limited thereto.

The unevenness structure 114 may be formed under the substrate 110. The unevenness structure 114 may be disposed under a light-transmitting substrate to change the critical angle of incident light.

Also, a reflection layer 170 may be disposed under the substrate 110. The reflection layer 170 may be formed along the shape of the unevenness structure 114. The reflection layer 170 may efficiently reflect light traveling to the substrate 110 through the active layer 140. The critical angle of light may be changed by the unevenness structures 122A and 114. Accordingly, the light extraction efficiency of the light emitting device can be improved.

Figure 10:
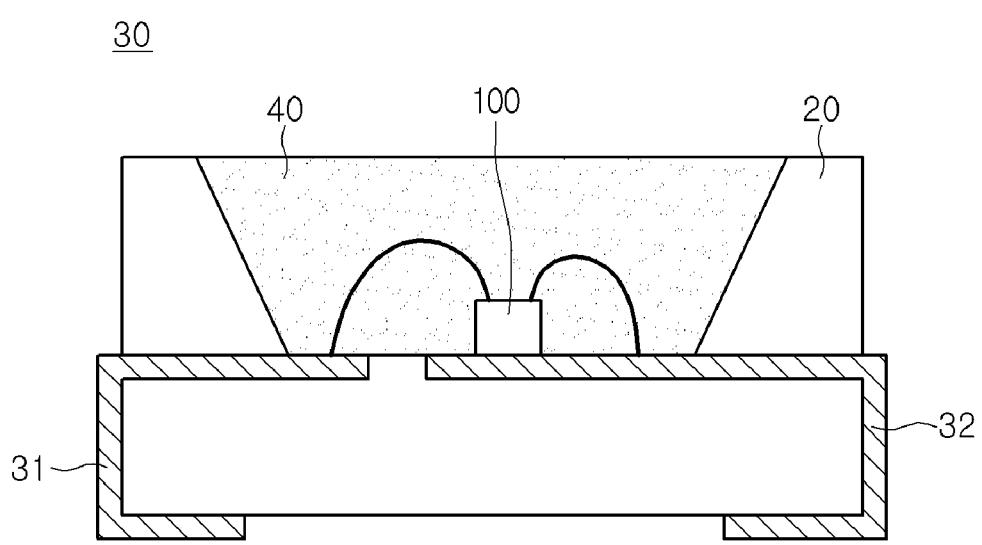
FIG. 10 is a cross-sectional view illustrating a light emitting device package including a light emitting device according to an embodiment.

FIG. 10 is a cross-sectional view illustrating a light emitting device package including a light emitting device 100 according to an embodiment.

Referring to FIG. 10, a light emitting device package 30 according to an embodiment may include a body 20, first lead electrode 31 and second lead electrode 32 in the body 20, a light emitting device 100 disposed on at least one of the first and second lead electrodes 31 and 32, and a molding member 40 covering the light emitting device 100.

The body 20 may be formed of silicon, synthetic resin, or metal materials. An inclined surface may be formed around the light emitting device 100. The body 20 has a cavity at least one side.

The first lead electrode 31 and the second lead electrode 32 may be electrically separated from each other, and may provide power to the light emitting device 100. Also, the first lead electrode 31 and the second lead electrode 32 may increase luminous efficiency, and may serve to discharge heat generated in the light emitting device 100 to the outside.

The light emitting device 100 may be disposed on the body or may be mounted on the first lead electrode 31 and/or the second lead electrode 32.

The light emitting device 100 may be electrically connected to the first lead electrode 31 and the second lead electrode 32 by any one of a wire method, flip-chip method, or die-bonding method.

The molding member 40 may surround and protect the light emitting device 100. Also, the molding member 40 may include a fluorescent substance, and may change the wavelength of light emitted from the light emitting device 100.

The molding member 40 may surround and protect the light emitting device 100. Also, the molding member 40 may include a fluorescent substance, and may change the wavelength of light emitted from the light emitting device 100. A lens (not shown) may be disposed on the mold member 40. The lens may contact or may not contact the molding member 40.

The light emitting device 100 may electrically contact the undersurface of a substrate or the body part through a through hole.

The light emitting device package 30 may include at least one of the light emitting devices according to the above embodiments, but embodiments are not limited thereto.

Although shown in a top-view type, the package according to the embodiment is implemented in a side-view type to show effects of improving the characteristics of heat-radiation, conductivity, and reflection. In a light emitting device of such a top-view or side-view type, a resin layer may be packaged, and then a lens is disposed or attached on the resin layer, but embodiments are limited thereto.

Lighting System

A light emitting device or light emitting device package according to an embodiment may be applied to a light unit. The light unit may include a structure in which a plurality of light emitting devices or light emitting device packages are arrayed, and may include lightings, traffic lights, vehicle headlights, and electronic display boards.

Figure 11:
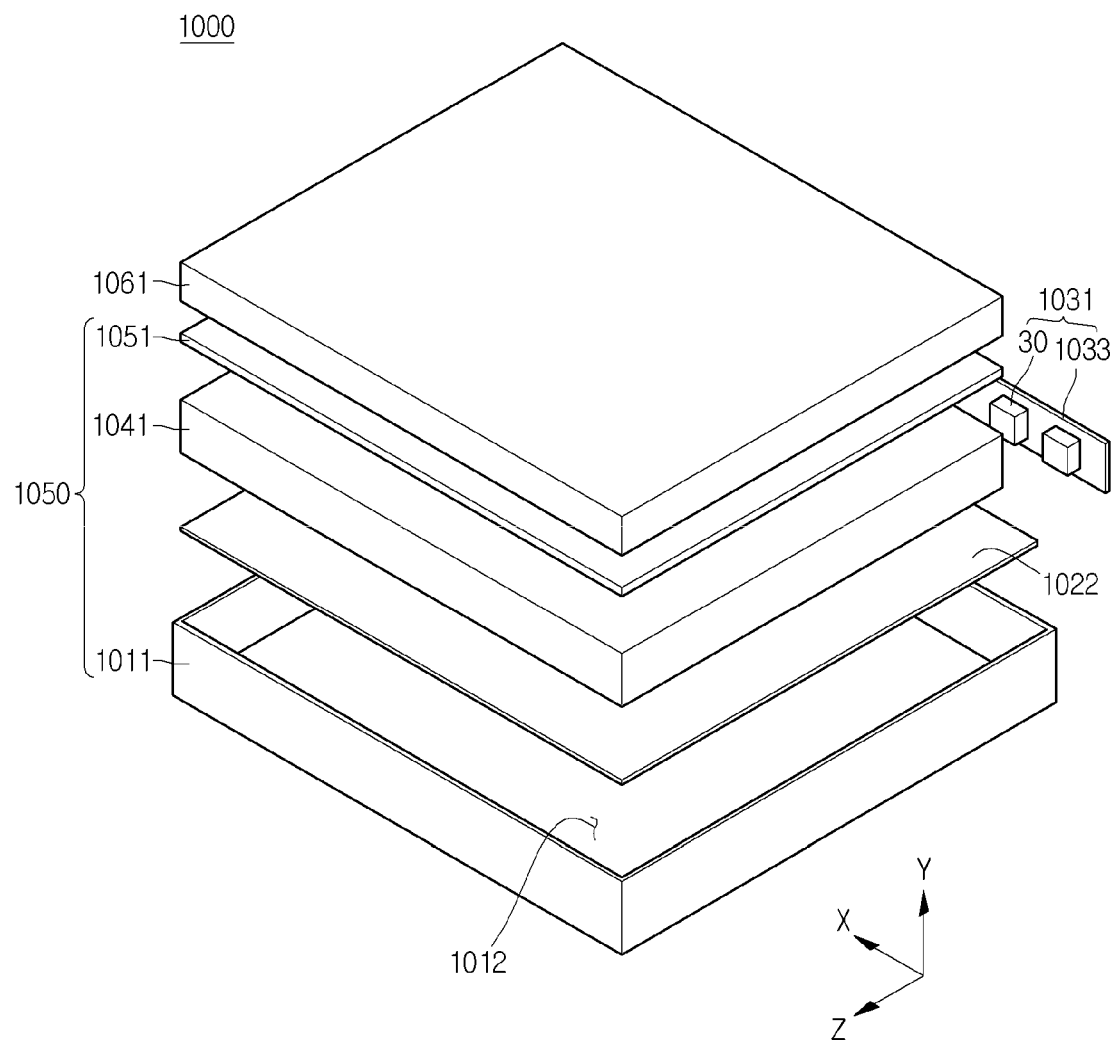
FIG. 11 is a view showing a display device having the light emitting device or the light emitting device package according to the embodiment.
Figure 12:
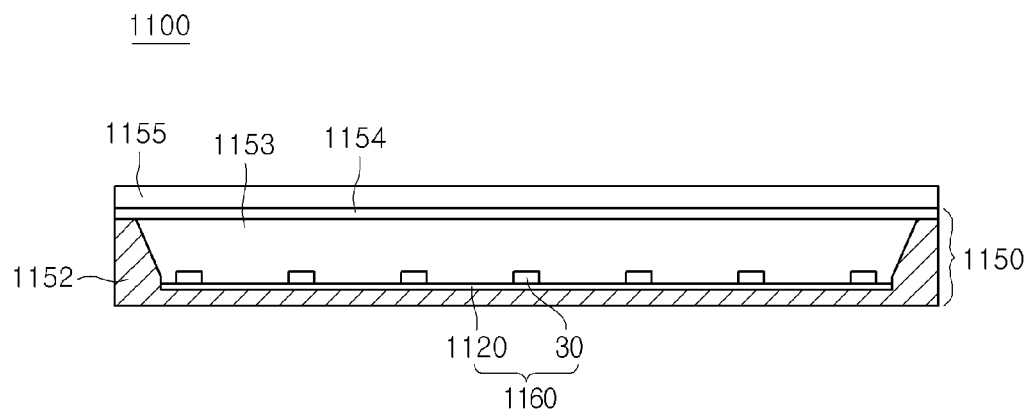
FIG. 12 is a view showing another example of a display apparatus having the light emitting device or the light emitting device package according to the embodiment.
Figure 13:
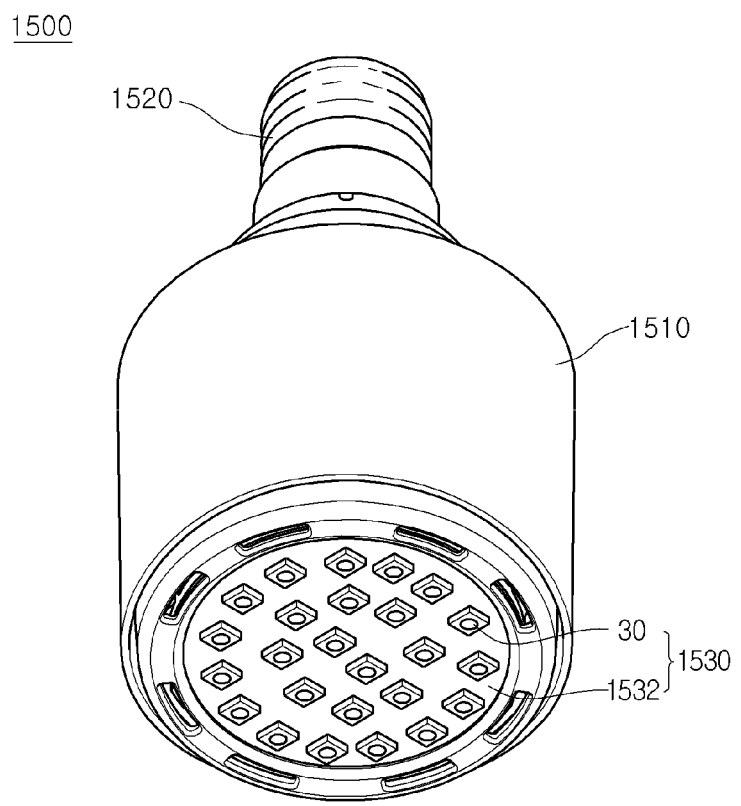
FIG. 13 is a view showing a lighting device having the light emitting device or the light emitting device package according to the embodiment.

The lighting system may include a display apparatus shown in FIGS. 11 and 12, a lighting device shown in FIG. 13, in addition to a lighting lamp, a signal light, a vehicle headlight, an electronic display, etc.

FIG. 11 is a disassembled perspective view of a display apparatus according to an embodiment.

Referring to FIG. 11, the display apparatus 1000 according to the embodiment may include a light guide panel 1041, a light emitting module 1031 supplying light to the light guide panel 1041, a reflective member 1022 under the light guide panel 1041, an optical sheet 1051 on the light guide panel 1041, a display panel 1061 on the optical sheet 1051, and a bottom cover 1011 receiving the light guide panel 1041, the light emitting module 1031, and the reflective member 1022, but the present disclosure is not limited thereto.

The bottom cover 1011, the reflective sheet 1022, the light guide panel 1041, and the optical sheet may be defined as a light unit 1041.

The light guide panel 1041 functions to transform linear light to planar light by diffusing the linear light. The light guide panel 1041 may be made of a transparent material, and may include one of acryl-series resin such as polymethyl metaacrylate (PMMA), polyethylene terephthlate (PET), poly carbonate (PC), COC, and polyethylene naphthalate resin.

The light emitting module 1031 provides light to at least a side surface of the light guide panel 1041, and finally acts as a light source of a display apparatus.

The light emitting module 1031 may include at least one light emitting module, and provide light directly or indirectly from one side surface of the light guide panel 1041. The light emitting module 1031 may include a board 1033, and a light emitting device package 30 according to embodiments disclosed above, and the light emitting device packages 30 may be arranged apart by a predetermined interval from each other on the board 1033.

The board 1033 may be a printed circuit board (PCB) including a circuit pattern (not shown). The board 1033 may include a metal core PCB (MCPCB), a flexible PCB (FPCB), etc. as well as the general PCB, but the present disclosure is not limited thereto. In the case where the light emitting device package 30 is mounted on a side surface or a heat releasing plate, the board 1033 may be removed. Herein, some of the heat releasing plate may contact an upper surface of the bottom cover 1011.

The plurality of light emitting device packages 30 may be mounted on the board 1033 such that light emitting surfaces of the plurality of light emitting device packages 30 are spaced apart by a predetermined distance from the light guide panel 1041, but the present disclosure is not limited thereto. The light emitting device package 30 may supply light to a light incident part that is one side surface of the light guide panel 1041, directly or indirectly, but the present disclosure is not limited thereto.

The reflective member 1022 may be provided under the light guide panel 1041. The reflective member 1022 reflects light incident from a lower surface of the light guide panel 1041 to allow the reflected light to be directed toward an upper direction, thereby capable of enhancing brightness of the light unit 1050. The reflective member 1022 may be formed of, for example, PET, PC, PVC resin, or the like, but the present disclosure is not limited thereto.

The bottom cover 1011 may receive the light guide panel 1041, the light emitting module 1031, the reflective member 1022, and the like. For this purpose, the bottom cover 1011 may have a receiving part 1012 formed in a box shape a top surface of which is opened, but the present disclosure is not limited thereto. The bottom cover 1011 may be coupled to a top cover, but the present disclosure is not limited thereto.

The bottom cover 1011 may be formed of a metal material or resin material, and may be manufactured by using a process such as a press molding or an injection molding. Also, the bottom cover 1011 may include metallic or nonmetallic material having a high thermal conductivity, but the present disclosure is not limited thereto.

The display panel 1061 is, for example, an LCD panel, and includes first and second transparent substrates facing each other, and a liquid crystal layer interposed between the first and second substrates. A polarizing plate may be attached on at least one surface of the display panel 1061, but the present disclosure is not limited thereto. The display panel 1061 displays information by using light passing through the optical sheet 1051. The display apparatus 1000 may be applied to a variety of mobile terminals, monitors for notebook computers, monitors for lap-top computers, televisions, etc.

The optical sheet 1051 is disposed between the display panel 1061 and the light guide panel 1041, and includes at least one transparent sheet. The optical sheet 1051 may include, for example, at least one of a diffusion sheet, a horizontal and/or vertical prism sheet, and a brightness reinforcing sheet. The diffusion sheet diffuses incident light, the horizontal and/or vertical prism sheet focuses incident light on a display region, and the brightness reinforcing sheet enhances the brightness by reusing lost light. Also, a protective sheet may be disposed on the display panel 1061, but the present disclosure is not limited thereto. Herein, the display apparatus 1000 may include the light guide panel 1041, and the optical sheet 1051 as optical members positioned on a light path of the light emitting module 1031, but the present disclosure is not limited thereto.

FIG. 12 is a cross-sectional view of a display apparatus according to an embodiment.

Referring to FIG. 12, the display apparatus 1100 includes a bottom cover 1152, a board 1120 on which the light emitting device packages 30 disclosed above are arrayed, an optical member 1154, and a display panel 1155.

The board 1120 and the light emitting device package 30 may be defined as a light emitting module 1060. The bottom cover 1152, the at least one light emitting module 1060, and the optical member 154 may be defined as a light unit.

The bottom cover 1152 may be provided with a receiving part, but the present disclosure is not limited thereto.

Herein, the optical member 1154 may include at least one of a lens, a light guide panel, a diffusion sheet, a horizontal and vertical prism sheet, and a brightness reinforcing sheet. The light guide panel may be formed of polycarbonate (PC) or poly methyl methacrylate (PMMA), and may be removed. The diffusion sheet diffuses incident light, the horizontal and vertical prism sheet focuses incident light on a display region, and the brightness reinforcing sheet enhances the brightness by reusing lost light.

The optical member 1154 is disposed on the light emitting module 1060. The optical member 154 transforms light emitted from the light emitting module 1060 to planar light, and performs diffusion, light focusing, and the like.

FIG. 13 is a perspective view of a lighting device according to an embodiment.

Referring to FIG. 13, the lighting unit 1500 may include a case 1510, a light emitting module 1530 equipped in the case 1510, and a connection terminal 1520 equipped in the case 1510 and supplied with an electric power from an external power supply.

The case 1510 may be preferably formed of a material having good heat shielding characteristics, for example, a metal material or a resin material.

The light emitting module 1530 may include a board 1532, and at least one light emitting device package 30 according to the embodiments mounted on the board 1532. The light emitting device package 30 may include a plurality of light emitting device packages which are arrayed apart by a predetermined distance from one another in a matrix configuration.

The board 1532 may be an insulator substrate on which a circuit pattern is printed, and may include, for example, a printed circuit board (PCB), a metal core PCB, a flexible PCB, a ceramic PCB, an FR-4 substrate, etc.

Also, the board 1532 may be formed of a material to efficiently reflect light, and a surface thereof may be formed in a color capable of efficiently reflecting light, for example, white color, or silver color.

The at least one light emitting device packages 30 may be mounted on the board 1532. Each of the light emitting device packages 30 may include at least one light emitting diode (LED) chip. The LED chip may include a color LED emitting red, green, blue or white light, and a UV LED emitting ultra-violet (UV).

The light emitting module 1530 may have a combination of various light emitting device packages so as to obtain desired color and luminance. For example, the light emitting module 1530 may have a combination of a white LED, a red LED, and a green LED so as to obtain a high color rendering index (CRI).

The connection terminal 1520 may be electrically connected to the light emitting module 1530 to supply power. The connection terminal 1520 may be screwed and coupled to an external power in a socket type, but the present disclosure is not limited thereto. For example, the connection terminal 1520 may be made in a pin type and inserted into an external power, or may be connected to the external power through a power line.

The package of the light emitting device 100 may be arranged on the substrate to realize the light emitting module. In addition, after the light emitting device is provided on the substrate, the resultant structure may be packaged to realize the light emitting module.

Embodiments may be implemented in a light emitting module in which packages packaged with light emitting devices as described above are arranged on a substrate, or may be implemented in a light emitting module in which the light emitting devices are arranged on a substrate.

The lighting system described above can obtain a desired optical effect, by disposing at least one of light guide members, diffusion sheets, light-condensing sheets, luminance enhancement sheets, and fluorescent sheets on the traveling path of light emitted from the light emitting module.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a substrate;
    a light-emitting structure layer on the substrate, the light-emitting structure layer including a first conductive type semiconductor layer, a second conductive type semiconductor layer, and an active layer between the first and second conductive type semiconductor layers; and
    a light-transmitting electrode layer on the second conductive type semiconductor layer,
    wherein the second conductive type semiconductor layer has a thickness satisfying Equation (1):

$$2 \cdot \Phi 1 + \Phi 2 = N \cdot 2\pi \pm \Delta, (0 \leq \Delta \leq \pi/2) \tag{1}$$

where $\Phi 1$ is a phase change that is generated when light of a vertical direction passes through the second conductive type semiconductor layer, $\Phi 2$ is a phase change that is generated when the light is reflected by the light-transmitting electrode layer, and N is a natural number, wherein $\Phi 1$ is expressed as Equation (2):

$$\Phi 1 = 2\pi n_2 d/\lambda \tag{2}$$

where $n_2$ is a refractive index of the second conductive type semiconductor layer, $\lambda$ is a wavelength of light emitted from the active layer, and d is the thickness of the second conductive type semiconductor layer,
    wherein the active layer has a thickness equal to or less than $\lambda/n_1$, where $n_1$ is a refractive index of the active layer,
    wherein all layers between the active layer and the substrate are formed in a nitride-based semiconductor.

2. The light emitting device according to claim 1, wherein the thickness of the second conductive type semiconductor layer ranges from about 90 nm to about 110 nm.

3. The light emitting device according to claim 2, wherein light reflected by the light-transmitting electrode layer and traveling to the substrate and light emitted from the active layer and traveling to the substrate generate the constructive interference by the thickness of the second conductive type semiconductor layer and the active layer.

4. The light emitting device according to claim 1, wherein the light-transmitting electrode layer comprises at least one of ITO, In—ZnO (IZO), Ga—ZnO (GZO), Al—ZnO (AZO), Al—Ga ZnO (AGZO), indium gallium tin oxide (IGTO), aluminum zinc oxide (AZO), antimony tin oxide (ATO), gallium zinc oxide (GZO), In—Ga ZnO (IGZO), IrOx, RuOx, RuOx/ITO, Ni/IrOx/Au, and Ni/IrOx/Au/ITO.

5. The light emitting device according to claim 1, wherein the light-transmitting electrode layer comprises a light extraction structure disposed therein.

6. The light emitting device according to claim 5, wherein the light extraction structure has a random roughness shape.

7. The light emitting device according to claim 5, wherein the light extraction structure comprises a photonic crystal structure.

8. The light emitting device according to claim 1, wherein the substrate has a refractive index lower than a refractive index of the first conductive type semiconductor layer.

9. The light emitting device according to claim 1, comprising a first electrode on the first conductive type semiconductor layer, and a second electrode on the light-transmitting electrode layer.

10. The light emitting device according to claim 1, wherein the substrate has an unevenness structure on a top surface and a bottom surface.

11. The light emitting device according to claim 10, wherein the thickness of the second conductive type semiconductor layer ranges from about 90 nm to about 110 nm.

12. A light emitting device comprising:
    a light-transmitting substrate;
    a light-emitting structure layer on the light-transmitting substrate, the light-emitting structure layer including a first conductive type semiconductor layer, a second conductive type semiconductor layer, and an active layer between the first and second conductive type semiconductor layers; and
    a light-transmitting electrode layer on the second conductive type semiconductor layer,
    wherein the light-transmitting electrode layer transmits a portion of the incident light, and reflects the other portion of the incident light;
    the second conductive type semiconductor layer has a thickness satisfying Equation (1) to allow light reflected by the light-transmitting electrode layer and traveling to the light-transmitting substrate and light emitted from the active layer and traveling to the light-transmitting substrate to generate a constructive interference:

$$2 \cdot \Phi 1 + \Phi 2 = N \cdot 2\pi \pm \Delta, (0 \leq \Delta \leq \pi/2) \tag{1}$$

where $\Phi 1$ is a phase change that is generated when light of a vertical direction passes through the second conductive type semiconductor layer, $\Phi_2$ is a phase change that is generated when the light is reflected by the light-transmitting electrode layer, and N is a natural number;
    the active layer has a thickness equal to or less than $\lambda/n_1$, where $n_1$ is a refractive index of the active layer, and $\lambda$ is a wavelength of light emitted from the active layer; and
    the light-transmitting substrate has a refractive index lower than a refractive index of the first conductive type semiconductor layer,
    wherein $\Phi 2$ equals 0,
    wherein $\Phi 1$ is expressed as Equation (2):

$$\Phi 1 = 2\pi n_2 d/\lambda \tag{2}$$

where $n_2$ is a refractive index of the second conductive type semiconductor layer, $\lambda$ is the wavelength of the light emitted from the active layer, and d is the thickness of the second conductive type semiconductor layer, wherein the active layer has a thickness equal to or less than $\lambda/n_1$, where $n_1$ is a refractive index of the active layer, wherein all layers between the active layer and the light-transmitting substrate are formed in a nitride based semiconductor.

13. The light emitting device according to claim 12, wherein the first conductive type semiconductor layer is an n-type semiconductor layer having a chemical formula of $In_xAl_yGa_{1-x-y}N$ ($0 \leq x \leq 1$, $0 \leq y \leq 1$, $0 \leq x+y \leq 1$), and the second conductive type semiconductor layer is a p-type semiconductor layer having a chemical formula of $In_xAl_yGa_{1-x-y}N$ ($0 \leq x \leq 1$, $0 \leq y \leq 1$, $0 \leq x+y \leq 1$).

14. The light emitting device according to claim 12, wherein the light-transmitting substrate comprises a sapphire ($Al_2O_3$) substrate.

15. The light emitting device according to claim 12, wherein the light-transmitting substrate has an unevenness structure on at least one of a top surface and a bottom surface.

16. The light emitting device according to claim 15, comprising a reflection layer on the bottom surface of the light-transmitting substrate.

17. The light emitting device according to claim 15, comprising a first semiconductor layer of the all layers between the light-transmitting substrate and the first conductive type semiconductor layer, wherein the first semiconductor layer has a lattice constant value between a lattice constant value of the light-transmitting substrate and a lattice constant value of the first conductive type semiconductor layer.

18. The light emitting device according to claim 15, comprising a first semiconductor layer of the all layers between the light-transmitting substrate and the first conductive type semiconductor layer, the first semiconductor layer having a conductivity lower than a conductivity of the first conductive type semiconductor layer.

19. A light emitting device package comprising:

a body;

first and second lead electrodes on the body;

a light emitting device on at least one of the first and second lead electrodes; and a molding member on the light emitting device, wherein the light emitting device comprises: a substrate; a light-emitting structure layer on the substrate, the light-emitting structure layer including a first conductive type semiconductor layer, a second conductive type semiconductor layer, and an active layer between the first and second conductive type semiconductor layers; and a light-transmitting electrode layer on the second conductive type semiconductor layer, and the second conductive type semiconductor layer has a thickness satisfying Equation (1):

$$2 \cdot \Phi 1 + \Phi 2 = N \cdot 2\pi \pm \Delta, (0 \leq \Delta \leq \pi/2) \qquad (1)$$

where $\Phi 1$ is a phase change that is generated when light of a vertical direction passes through the second conductive type semiconductor layer, $\Phi 2$ is a phase change that is generated when the light is reflected by the light-transmitting electrode layer, and N is a natural number, wherein $\Phi 1$ is expressed as Equation (2):

$$\Phi 1 = 2\pi n_2 d/\lambda \qquad (2)$$

where $n_2$ is a refractive index of the second conductive type semiconductor layer, $\lambda$ is a wavelength of light emitted from the active layer, and d is the thickness of the second conductive type semiconductor layer, wherein $\Phi 2$ equals 0, wherein the active layer has a thickness equal to or less than $\lambda/n_1$, where $n_1$ is a refractive index of the active layer, wherein all layers between the active layer and the light-transmitting substrate are formed in a nitride-based semiconductor.

\* \* \* \* \*